(12) United States Patent
Herz

(10) Patent No.: US 8,129,813 B2
(45) Date of Patent: Mar. 6, 2012

(54) OPTOELECTRONIC SENSOR AND DEVICE FOR 3D DISTANCE MEASUREMENT

(75) Inventor: Manfred Herz, Mainz (DE)

(73) Assignee: IC-Haus GmbH, Bodenheim (DE)

( * ) Notice: Subject to any disclaimer, the term of this patent is extended or adjusted under 35 U.S.C. 154(b) by 1346 days.

(21) Appl. No.: 10/572,196

(22) PCT Filed: Jul. 28, 2004

(86) PCT No.: PCT/EP2004/008437
§ 371 (c)(1),
(2), (4) Date: Sep. 21, 2006

(87) PCT Pub. No.: WO2005/036647
PCT Pub. Date: Apr. 21, 2005

(65) Prior Publication Data
US 2007/0164767 A1    Jul. 19, 2007

(30) Foreign Application Priority Data
Sep. 18, 2003 (DE) .................. 103 43 709

(51) Int. Cl.
*H01L 31/06* (2006.01)
*H01L 27/15* (2006.01)
(52) U.S. Cl. .......................... 257/461; 257/80
(58) Field of Classification Search .................. 257/48, 257/80, 84, 83, 184, 186, 461, 462, E27.122, 257/E27.127
See application file for complete search history.

(56) References Cited

U.S. PATENT DOCUMENTS
7,288,801 B2 * 10/2007 Raynor ................... 257/184
7,411,265 B2 * 8/2008 Sekiguchi .................. 257/461

FOREIGN PATENT DOCUMENTS
DE   197 04 496 A1   3/1998
DE   198 21 974 A1   11/1999
EP   1 513 202 A1    3/2005
WO   WO 02/33922     4/2002

OTHER PUBLICATIONS

Heinol et al., "Photomischdetektor Graps 3D-Pictures; New Opticle Building Element Unites Detection and Mixture," Electronic, Franzis Verlag GmbH, Munchen, Germany, vol. 48, No. 12, pp. 80, 82, 84, 86, 88, 90 (Jun. 15, 1999).
Weste et al., CMOS Processing Technology, Principles of CMOS VLSI Design, A Systems Perspective, 1985, pp. 64-67, Addison-Wesley Publishing Company.
Weste et al., CMOS Processing Technology, Principles of CMOS VLSI Design, A Systems Perspective, 1993, pp. 109-113, Addison-Wesley Publishing Company.

* cited by examiner

*Primary Examiner* — Hung Vu
(74) *Attorney, Agent, or Firm* — Ryan, Mason & Lewis, LLP

(57) ABSTRACT

The present invention relates to an optoelectronic sensor for 5 demodulating a modulated photon flux (50), and to a measuring device, in particular for 3D distance measurement, having at least one optoelectronic sensor of this type. The optoelectronic sensor has at least two collecting zones 10 introduced in a semiconductor region (10), which collecting zones are for example diffused into the semiconductor region and doped inversely with respect to the semiconductor region (10). The collecting zones serve for collecting and tapping off minority carriers generated upon penetration of a modulated photon flux (50). Furthermore, at least two control zones are introduced in the semiconductor region (10), which control zones generate a drift field in a manner dependent on a control voltage that can be applied to the control zones, the control zones being of the same doping type as the semiconductor region (10).

10 Claims, 2 Drawing Sheets

US 8,129,813 B2

OPTOELECTRONIC SENSOR AND DEVICE FOR 3D DISTANCE MEASUREMENT

FIELD OF THE INVENTION

The invention relates to an optoelectronic sensor for demodulating a modulated photon flux, and to a measuring device having at least one electronic sensor and serving for 3D distance measurement by determining the propagation time of a modulated photon flux.

BACKGROUND OF THE INVENTION

Methods and devices for 3D object measurement are sufficiently known. Thus, DE 197 04 496 C2, inter alia, describes a photonic mixer device (PMD) which can be used for measuring passive objects. The photonic mixer device contains a p-doped silicon substrate, on which at least two light-sensitive modulation photogates are arranged. Accumulation gates likewise arranged on the p-doped silicon substrate are assigned to the modulation photogates. The modulation photogates are operated with a modulating push-pull voltage. Intensity-modulated light incident on the p-doped silicon substrate generates minority charge carriers which drift under the influence of the modulating push-pull voltage to the accumulation gates, where they are integrated. A prerequisite for an object measurement is that a predefined phase relationship exists between the phase of the push-pull voltages and the phase of the intensity-modulated light emitted by a transmitter. One disadvantage of such a photonic mixer device can be seen in the fact that the modulation photogates and the accumulation gates are applied on the silicon substrate, and thus restrict the optical sensor region of the photonic mixer device. Furthermore, it is not possible to generate a constant drift field in the substrate with the modulation photogates arranged on the silicon substrate.

DE 100 47 170 C2 discloses a PMD system by means of which not only the intensity but also the propagation time of an intensity-modulated light wave that is emitted by a transmitter and received by a photonic mixer device can be measured. However, the patent specification is not concerned with the realization of photonic mixer devices.

DE 198 21 974 A1 discloses a device and a method for detecting the phase and amplitude of electromagnetic waves using is photonic mixer detectors. In a manner similar to the photonic mixer detector according to DE 197 04 496 C2, modulation photogates and accumulation gates are situated on a semiconductor substrate. In contrast to the modulation photogates and accumulation gates in accordance with DE 197 04 496 C2 the modulation photogates and also accumulation gates in accordance with DE 198 21 974 A1 have the form of elongate, narrow and parallel strips.

SUMMARY OF THE INVENTION

The present invention is therefore based on the object of providing an optoelectronic sensor in which the sensor region is not shaded by gates and in which an essentially homogeneous drift field can be generated.

A central concept of the invention can be seen in the fact that the drift field required for demodulating an intensity-modulated photon flux is generated directly in a semiconductor region of the sensor. A homogeneous drift field can be generated in this way. At the same time, the optical sensor region above the semiconductor region is free of electrodes and can thus be optimized in terms of its optical properties.

The abovementioned technical problem is solved first of all by means of an optoelectronic sensor for demodulating a modulated, in particular intensity-modulated, photon flux.

For this purpose, the optoelectronic sensor has a semiconductor region, which is preferably p-doped. At least two collecting zones are introduced in the semiconductor region, said collecting zones for example being diffused into the semiconductor region and being doped inversely with respect to the semiconductor region. The collecting zones serve for collecting and tapping off minority carriers generated when a modulated photon flux penetrates into the semiconductor region. Furthermore, at least two control zones are introduced in the semiconductor region, which control zones can generate a drift field in a manner dependent on a control voltage that can be applied to the control zones, the control zones being of the same doping type as the semiconductor region.

As an alternative, the collecting zones may also be produced by local charge transfers in the semiconductor region.

The subclaims relate to advantageous developments.

A semiconductor substrate is expediently provided which carries or contains the semiconductor region and is doped more highly than the semiconductor region.

As an alternative to the more highly doped substrate, the semiconductor region may be applied as a semiconductor layer on a dielectric as well.

In order to be able to generate a sufficiently strong drift field in the vicinity of the collecting zones, the control zones are at a greater distance from the midpoint of the sensor than the collecting zones. The drift field spans the collecting zones in this way.

The abovementioned technical problem is likewise solved by means of a measuring device which may serve in particular for 3D distance measurement.

The measuring device has at least one optoelectronic sensor as claimed in one of claims 1 to 12. Furthermore, an optical transmitter is provided which serves for generating and emitting a modulated, in particular intensity-modulated, photon flux having a predetermined phase. Furthermore, a device for generating a control voltage is provided, the phase of the control voltage being in a fixed relationship with the phase of the photon flux generated by the transmitter. The collecting zones are assigned an evaluation device designed for determining the amplitude and phase of the modulated photon flux with respect to the phase of the control voltage. It should be noted that the optoelectronic sensor is in principle a photonic mixer detector which may correspond for example to a pixel of a camera chip. If, in the semiconductor region, more than one collecting zone pair are embedded between the two control zones, the optoelectronic sensor may also function as a multipixel sensor. In this way, a two-dimensional pixel array can also be formed through the arrangement of a plurality of collecting zone pairs.

As an alternative, an optoelectronic sensor for demodulating a modulated photon flux may be provided, having a semiconductor region, at least two collecting zones present at a surface of the semiconductor region and serving for collecting and tapping off minority carriers generated when a modulated photon flux penetrates into the semiconductor region, and at least two capacitive elements for capacitively coupling in an AC voltage which generates a drift field. The collecting zones are arranged between the capacitive elements.

The capacitive elements may be capacitors or reverse-biased Schottky diodes.

As an alternative, the capacitive elements may contain zones which are inversely doped with respect to the semiconductor region and form a pn junction with the semiconductor region, said pn junction being reverse-biased during operation.

The collecting zones are expediently formed as Schottky diodes which are reverse-biased during operation.

The invention is explained in more detail below on the basis of an exemplary embodiment in conjunction with the drawings.

DETAILED DESCRIPTION OF DRAWINGS

Figure 1:
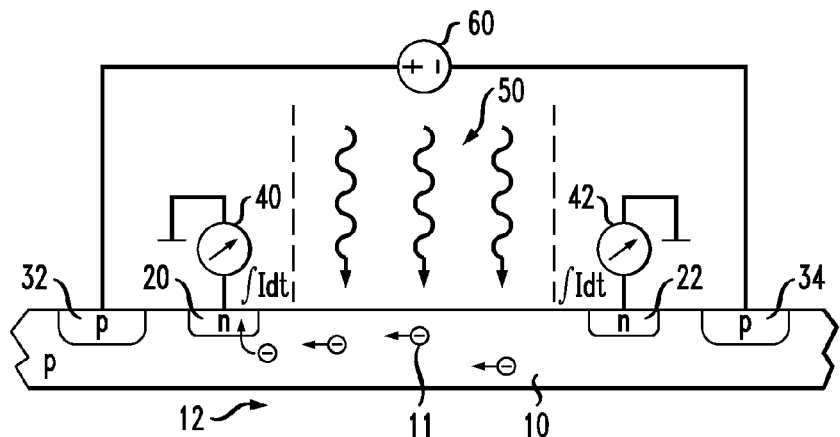
FIG. 1 shows an optoelectronic sensor in cross section with a connected, schematically illustrated evaluation device, a control voltage of predetermined polarity being applied to the control zones.
Figure 3:
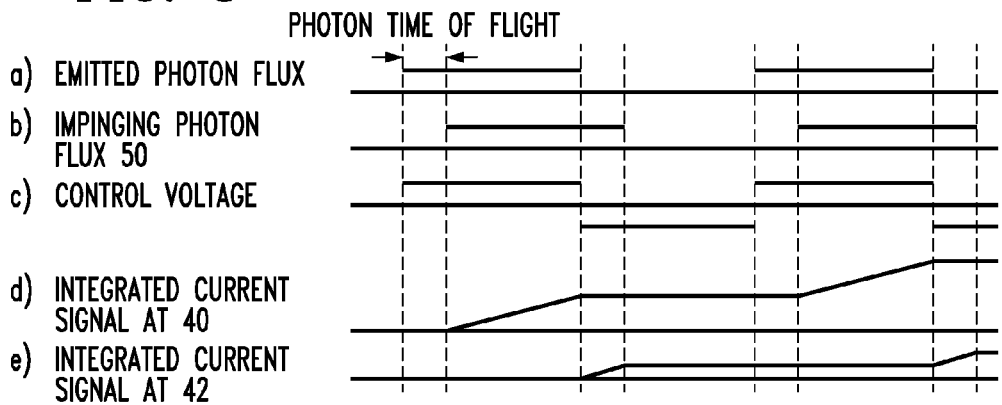
FIGS. 3a-e show the profile of an intensity-modulated photon flux emitted by a transmitter, the profile of the photon flux impinging on the optoelectronic sensor shown in FIG. 1, the profile of the drift or control voltage, the profile of the integrated electric current tapped off at the collecting zone 20, and the profile of the integrated electric current tapped off at the collecting zone 22.

FIG. 1 shows an optoelectronic sensor, which may also be referred to as an optoelectronic detector. The optoelectronic sensor has a semiconductor region, in the present case a semiconductor layer 10, which is p-doped in the present example. Two p-doped zones 32, 34 are diffused into the semiconductor layer 10, said p-doped zones being referred to as control zones hereinafter. Furthermore, two n-doped zones 20, 22 are diffused into the semiconductor layer 10, said n-doped zones being referred to as collecting zones hereinafter. The collecting zones 20 and 22 and also the control zones 32 and 34 extend from a surface of the semiconductor layer into the semiconductor layer 10. With respect to the imaginary midpoint of the sensor, the control zones 32 and 34 are situated further outwardly than the collecting zones 20 and 22. A controllable voltage source 60 is connected to the control zones 32 and 34, which voltage source, as will be explained in more detail below, generates a control voltage (illustrated in FIG. 3c), also called drift voltage, in order to generate a homogeneous drift field in the semiconductor layer 10. Furthermore, the collecting zones 20 and 22 are assigned an evaluation device, which, for the sake of simpler illustration, is merely illustrated symbolically by the two charge meters 40 and 42. The charge meter 40 is connected to the collecting zone 20 and measures the integrated current which can be tapped off at the collecting zone 20 and the temporal profile of which is shown in FIG. 3d. The charge meter 42 is connected to the collecting zone 22 and can measure the integrated current which can be tapped off at the collecting zone 22 and the temporal profile of which is illustrated in FIG. 3e.

Figure 2:
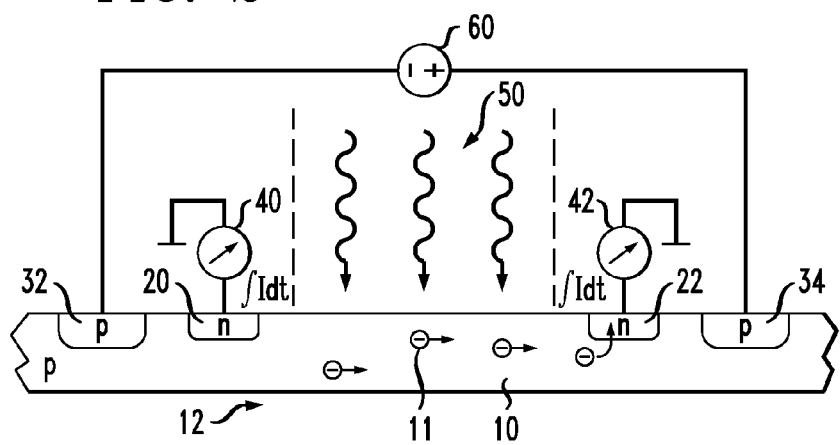
FIG. 2 shows the optoelectronic sensor according to FIG. 1, a control voltage whose polarity has been reversed being applied to the control zones.

FIG. 2 shows the optoelectronic sensor illustrated in FIG. 1, wherein merely the polarity of the voltage source 60 applied to the control zones 32 and 34 has been interchanged.

As shown in FIGS. 1 and 2, the semiconductor layer 10 is applied on a dielectric 12, for example.

The text below will explain the functioning of the optoelectronic sensor in conjunction with a measuring device for 3D distance measurement with regard to an object (not illustrated).

It shall be assumed that an optical transmitter (not illustrated), also called photon source, generates and emits an intensity-modulated photon flux, the profile of which is illustrated in FIG. 3a. The intensity-modulated photon flux is reflected for example at an object to be measured and, after a specific photon time of flight, which is entered in FIG. 3a, impinges as photon flux 50 on the active sensor zone of the optoelectronic sensor, as is illustrated in FIG. 1 and FIG. 2. The temporally delayed photon flux 50 is illustrated in FIG. 3b. The photon flux 50 penetrating into the semiconductor layer 10 generates charge carrier pairs in the semiconductor layer 10, of which charge carrier pairs only the electrons 11 functioning as minority carriers are illustrated. In order to be able to measure the amplitude and phase of the photon flux 50 with respect to the phase of the control voltage, a control voltage is applied to the p-doped control zones 32 and 34, the profile of said control voltage being illustrated in FIG. 3c. As illustrated in FIG. 1 and FIG. 2, the control voltage can be generated by electronically changing over the voltage source 60. An important prerequisite for an object measurement is that the phase of the photon flux emitted at the optical transmitter is in a fixed relationship with the phase of the control voltage, as is illustrated by the curve profiles illustrated in FIGS. 3a and 3c. The control voltage applied to the p-doped control zones 32 and 34 brings about in the semiconductor layer 10 a drift field which runs essentially homogeneously in the semiconductor layer 10 between the collecting zones 20 and 22. The direction of the drift field is changed in a manner dependent on the control voltage applied to the control zones 32 and 34. In this way, the minority carriers 11 generated in the semiconductor layer 10 are accelerated in the first place toward the collecting zone 20 and secondly toward the collecting zone 22. When flying under the n-doped collecting zones 20 and 22, the electrons 11 may be trapped by the space charge zone engendered, be collected in the collecting zones 20 and 22 and be tapped off as a measurable electric current by the evaluation device 40, 42. The profile of the control voltage as illustrated in FIG. 3c ensures that during a positive control voltage, a drift field is generated which, if the modulated photon flux 50 impinges on the sensor surface, drives the generated electrons 11 to the collecting zone 20. During a positive control voltage, the electrons 11 are accordingly collected at the collecting zone 20, as a result of which a current flow can be tapped off at the collecting zone 20. The profile of the control voltage as illustrated in FIG. 3c furthermore ensures that during a negative control voltage, a drift field is generated which, if the intensity-modulated photon flux 50 impinges on the sensor surface, drives the generated electrons 11 to the collecting zone 22. During a negative control voltage, the electrons 11 are accordingly collected at the collecting zone 22, as a result of which a current flow can be tapped off at the collecting zone 22. The profile of the integrated current that results at the collecting zone 20 depending on the impinging photon flux 50 and the control voltage is illustrated in FIG. 3d, while the profile of the integrated current that results at the collecting zone 22 depending on the impinging photon flux 50 and the control voltage is shown in FIG. 3e.

The evaluation device 40, 42 is formed in such a way that it can determine the sum of the integrated currents that can be tapped off at the collecting zones 20 and 22, which is a measure of the amplitude of the photon flux 50. The evaluation device 40, 42 can likewise determine the ratio of the integrated current that can be tapped off at the collecting zone 20 to the integrated current that can be tapped off at the collecting zone 22, which is a measure of the phase of the photon flux 50 impinging on the sensor with respect to the phase of the control voltage profile illustrated in FIG. 3c. If, as is illustrated in FIGS. 3a and 3c, the phase of the photon flux generated by the transmitter is equal to the phase of the control voltage generated by the voltage source 60, the ratio of the integrated currents that can be tapped off at the collecting zones 20 and 22 is a measure of the time of flight of the photons from the object to be measured until they impinge on the sensor, and is thus a measure of the distance covered by the photons.

Figure 4:
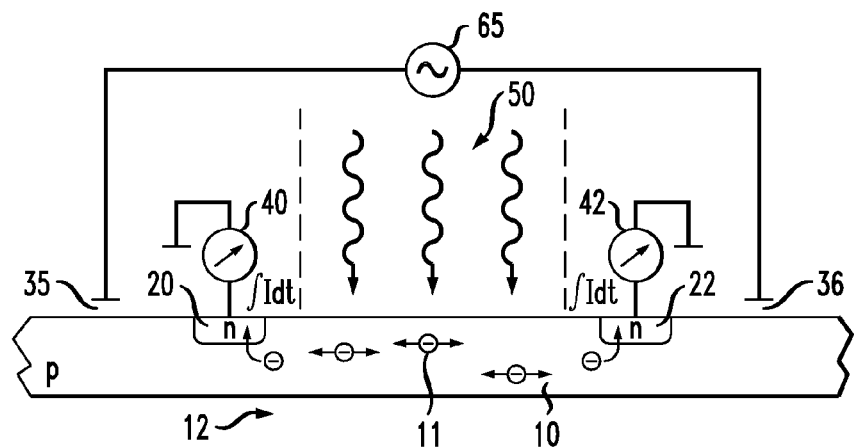
FIG. 4 shows an optoelectronic sensor in cross section with a connected, schematically illustrated evaluation device and two capacitors for capacitively coupling in a control voltage into the semiconductor region.

FIG. 4 shows an optoelectronic sensor, which differs from the optoelectronic sensor shown in FIG. 1 in that instead of the control zones 32 and 34, a capacitor 35 and 36, respectively, is applied on the surface of the semiconductor region 10, to which is applied, by means of an AC voltage source 65, an AC voltage for generating a drift field in the semiconductor region. The capacitors 35 and 36 are spatially separated from the collecting zones 20 and 22, the collecting zones 20 and 22 being arranged between the capacitors 35 and 36. Instead of the capacitors, it is also possible to use Schottky diodes that are reverse-biased.

Figure 5:
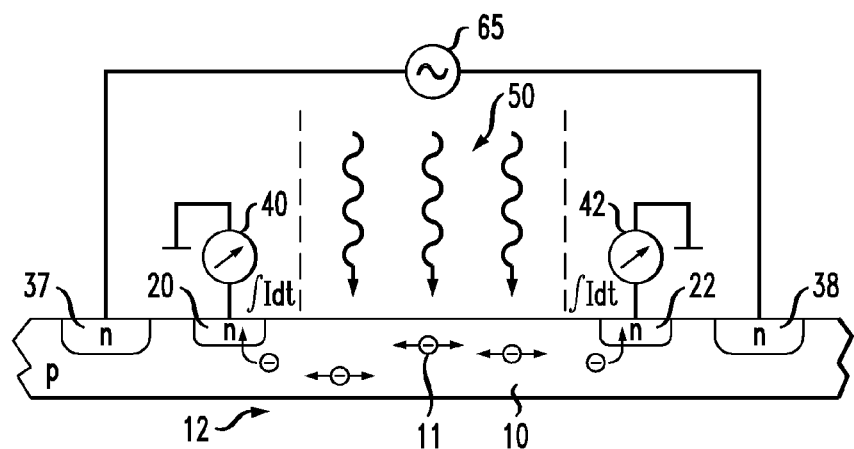
FIG. 5 shows an optoelectronic sensor in cross section with a connected, schematically illustrated evaluation device and two reverse-biased diodes for capacitively coupling in a control voltage into the semiconductor region.

FIG. 5 shows an optoelectronic sensor, which differs from the optoelectronic sensor shown in FIG. 1 in that instead of the p-doped control zones 32 and 34, n-doped zones 37 and 38 are introduced, which form a pn junction in the semiconductor region 10 and are operated in reverse-biased fashion. An AC voltage is applied to the n-doped zones 37 and 38 by means of an AC voltage source 65 and serves for generating a drift field between the collecting zones 20 and 22. The collecting zones 20 and 22 are arranged in a manner spatially separated from the n-doped zones 37 and 38 and between the latter.

For the rest, the construction of the optoelectronic sensors shown in FIGS. 4 and 5 corresponds to the construction of the sensors described in conjunction with FIGS. 1 and 2. Identical reference symbols thus also identify identical features.

It should furthermore be noted that the collecting zones 20 and 22 of the optoelectronic sensors may be formed as Schottky diodes.

The invention claimed is:

1. An optoelectronic sensor for demodulating a modulated photon flux (50) comprising:
    a semiconductor region (10);
    at least two collecting zones (20, 22) present in the semiconductor region (10) and serving for collecting and tapping off minority carriers (11) generated when said modulated photon flux (50) penetrates into the semiconductor region (10), the collecting zones (20, 22) being doped inversely with respect to the semiconductor region (10);
    characterized by at least two control zones (32, 34) introduced in the semiconductor region (10) and serving for generating a drift field in a manner dependent on a control voltage that can be applied to the control zones (32, 34), the control zones (32, 34) being of the same doping type as the semiconductor region (10).

2. The optoelectronic sensor as claimed in claim 1, wherein the semiconductor region (10) is situated above or in a semiconductor substrate (12), which is doped more highly than the semiconductor region (10).

3. The optoelectronic sensor as claimed in claim 1, wherein the semiconductor region (10) is applied on a dielectric (12).

4. The optoelectronic sensor as claimed in claim 1, wherein the control zones (32, 34) are at a greater distance from the midpoint of the sensor than the collecting zones (20, 22).

5. The optoelectronic sensor as claimed in claim 1, wherein the semiconductor region (10) is p-doped.

6. The optoelectronic sensor as claimed in claim 1, wherein the collecting zones (20, 22) are diffused.

7. The optoelectronic sensor as claimed in claim 1, wherein the collecting zones (20, 22) are produced by local charge transfers in the semiconductor region (10).

8. A measuring device in particular for 3D distance measurement, comprising
    at least one optoelectronic sensor as claimed in claim 1,
    an optical transmitter for generating a modulated photon flux having a predetermined phase,
    a device (60) for generating a control voltage, the phase of the control voltage being in a fixed relationship with the phase of the photon flux generated by the transmitter, and
    an evaluation device (40, 42) assigned to the collecting zones (20, 22) and serving for determining the amplitude and the phase of the modulated photon flux with respect to the phase of the control voltage.

9. The optoelectric sensor as claimed in claim 1, wherein the collecting zones (20, 22) are formed as Schottky diodes.

10. The optoelectronic sensor as claimed in claim 1, wherein the semiconductor region (10), more than one collecting zone pair is embedded between the at least two control zones (32,34) or two capacitive elements (35, 36, 37, 38).

* * * * *